(12) United States Patent
Hayashi et al.

(10) Patent No.: US 7,889,319 B2
(45) Date of Patent: Feb. 15, 2011

(54) EXPOSURE APPARATUS AND DEVICE FABRICATION METHOD

(75) Inventors: Naoto Hayashi, Utsunomiya (JP); Shinichiro Hirai, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 168 days.

(21) Appl. No.: 12/369,581

(22) Filed: Feb. 11, 2009

(65) Prior Publication Data

US 2009/0207400 A1    Aug. 20, 2009

(30) Foreign Application Priority Data

Feb. 15, 2008  (JP) .............................. 2008-035084

(51) Int. Cl.
G03B 27/42  (2006.01)
G03B 27/54  (2006.01)

(52) U.S. Cl. ...................................... 355/53

(58) Field of Classification Search ................... 355/52, 355/53, 55, 67–71; 356/399–401, 495
See application file for complete search history.

(56) References Cited

U.S. PATENT DOCUMENTS 7,106,452 B2 *   9/2006  Ouchi ........................ 356/495
7,283,207 B2 *  10/2007  Nomura ........................ 355/67
7,605,914 B2 *  10/2009  Stammler et al. ........ 356/239.2
2006/0170932 A1   8/2006  Hayashi et al.
2007/0046922 A1   3/2007  Kadono et al.

FOREIGN PATENT DOCUMENTS

JP    2006-214856 A    8/2006
JP    2007-059566 A    3/2007
KR    10-0379521 B     4/2003

* cited by examiner

*Primary Examiner*—Hung Henry Nguyen
(74) *Attorney, Agent, or Firm*—Canon U.S.A., Inc., IP Division (57) ABSTRACT

The present invention provides an exposure apparatus including a measuring unit which includes an imaging optical system configured to guide light having propagated through a projection optical system to an image sensor, and is configured to measure the overall birefringence of the imaging optical system and the projection optical system, a calibration unit which is set on a side of an object plane of the projection optical system in order to measure a birefringence of the imaging optical system, and is configured to reflect the light from the measuring unit back to the measuring unit without using the projection optical system, and a calculation unit configured to isolate, from the result of measuring the overall birefringence, the birefringence of the imaging optical system measured by the measuring unit, thereby calculating the birefringence of the projection optical system.

9 Claims, 5 Drawing Sheets

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

A projection exposure apparatus has conventionally been employed to fabricate a micropatterned semiconductor device such as a semiconductor memory or logic circuit by using photolithography. The projection exposure apparatus projects and transfers a circuit pattern formed on a reticle (mask) onto a substrate such as a wafer via a projection optical system.

Along with the recent advance in micropatterning of semiconductor devices, the projection exposure apparatus is being required to further improve the resolving power (a minimum feature size that the exposure apparatus can transfer) than ever. To meet this demand, the wavelength of the exposure light is shortening, and the development of a high-NA projection optical system is in progress (the numerical aperture (NA) of the projection optical system is increasing). For example, a projection exposure apparatus which uses an ArF excimer laser beam having a wavelength of about 193 nm as the exposure light and includes a projection optical system having an NA more than 0.8 attains a resolving power of 0.1 µm. Also, an immersion exposure apparatus has already been proposed, which increases the NA of the projection optical system by the so-called immersion method of filling at least a part of the space between the wafer and the final surface (final lens) of the projection optical system with a liquid having a refractive index higher than 1. Under the circumstances, a further improvement in the resolving power than ever is being expected.

To achieve an improvement in the resolving power of the exposure apparatus, it is indispensable to precisely evaluate the performance (for example, the imaging performance) of the projection optical system. Conventionally, the transmitted wavefront aberration has been mainly used to evaluate the performance of the projection optical system as mounted in the exposure apparatus or that of the projection optical system during assembly. Along with an improvement in the performance of the projection optical system, the influence of the birefringence of the projection optical system is becoming non-negligible. To keep up with this recent trend, it is necessary to evaluate not only the transmitted wavefront aberration but also the birefringence (the birefringence on the pupil plane) of the projection optical system.

To meet this need, Japanese Patent Laid-Open No. 2006-214856 proposes a measuring apparatus in which an interferometer for measuring the transmitted wavefront aberration in assembling the projection optical system is additionally imparted with a function of measuring the birefringence of the projection optical system. The measuring apparatus disclosed in Japanese Patent Laid-Open No. 2006-214856 mounts an imaging optical system in order to measure (evaluate) the birefringence (birefringence distribution) of the projection optical system. To accurately measure (evaluate) the birefringence of the projection optical system, it is necessary to isolate the birefringence of the imaging optical system (to be referred to as the "system error" hereinafter) mounted in the measuring apparatus, and that of the projection optical system.

The birefringence is generally represented by a Jones matrix, so matrix calculation is necessary to isolate the system error and the birefringence of the projection optical system (that is, to calibrate the measuring apparatus). For example, Japanese Patent Laid-Open No. 2006-214856 separately measures the birefringence of the forward path from the light source to the projection optical system (an optical system inserted in the optical path from the light source to the projection optical system), and that of the backward path from the projection optical system to the light detection unit (an optical system inserted in the optical path from the projection optical system to the light detection unit). Then, the Jones matrix representing the measurement value containing the system error and the birefringence of the projection optical system (that is, the measurement result obtained by the measuring apparatus) is multiplied by the inverse matrices of the Jones matrices representing the birefringences of the forward and backward paths, thereby isolating the system error and the birefringence of the projection optical system.

Unfortunately, Japanese Patent Laid-Open No. 2006-214856 discloses merely a technique used in assembling the projection optical system, and discloses no technique of measuring the birefringence of the projection optical system as mounted in the exposure apparatus, and isolating the system error of the measuring apparatus used in measuring that birefringence. In other words, this patent reference proposes no technique of accurately measuring the birefringence (birefringence distribution) of the projection optical system as mounted in the exposure apparatus.

The technique disclosed in Japanese Patent Laid-Open No. 2006-214856 inserts a mirror and prism at positions at which the incident angle of light is 5° or less in the imaging optical system mounted in the measuring apparatus, divides the optical path in the measuring apparatus into four, and measures the birefringences of these optical paths, thereby obtaining the birefringences of the forward and backward paths. Therefore, to isolate the system error and the birefringence of the projection optical system, birefringence measurement must be performed a number of times (at least four times), which requires a long measurement time.

SUMMARY OF THE INVENTION

The present invention provides an exposure apparatus which can accurately measure the birefringence of a projection optical system as mounted in the exposure apparatus in a short period of time.

According to the first aspect of the present invention, there is provided an exposure apparatus comprising a projection optical system configured to project a pattern of a reticle held by a first stage onto a substrate held by a second stage, a measuring unit which includes an imaging optical system configured to guide light having propagated through the projection optical system to an image sensor, and is configured to measure the overall birefringence of the imaging optical system and the projection optical system, a calibration unit which is set on a side of an object plane of the projection optical system in order to measure a birefringence of the imaging optical system in calibrating the measuring unit, and is configured to reflect the light from the measuring unit back to the measuring unit without using the projection optical system, and a calculation unit configured to isolate, from the result of measuring the overall birefringence of the imaging optical system and the projection optical system by the measuring unit, the birefringence of the imaging optical system measured by the measuring unit by setting the calibration unit on the side of the object plane of the projection optical system, thereby calculating the birefringence of the projection optical system, wherein the imaging optical system includes a forward-path optical system configured to guide light from a light source to the projection optical system, and a backward-path optical system configured to guide the light having propagated through the projection optical system to the image sensor, the calibration unit set on the side of the object plane of the projection optical system reflects the incident light back to the measuring unit so that the measuring unit measures the birefringence of the imaging optical system, and the calibration unit set on the side of the object plane of the projection optical system reflects at least three different linearly polarized light components of the incident light back to the measuring unit so that the measuring unit measures a birefringence of the backward-path optical system.

According to the second aspect of the present invention, there is provided a device fabrication method comprising steps of exposing a substrate using an exposure apparatus, and performing a development process for the substrate exposed, wherein the exposure apparatus includes a projection optical system configured to project a pattern of a reticle held by a first stage onto the substrate held by a second stage, a measuring unit which includes an imaging optical system configured to guide light having propagated through the projection optical system to an image sensor, and is configured to measure the overall birefringence of the imaging optical system and the projection optical system, a calibration unit which is set on a side of an object plane of the projection optical system in order to measure a birefringence of the imaging optical system in calibrating the measuring unit, and is configured to reflect the light from the measuring unit back to the measuring unit without using the projection optical system, and a calculation unit configured to isolate, from the result of measuring the overall birefringence of the imaging optical system and the projection optical system by the measuring unit, the birefringence of the imaging optical system measured by the measuring unit by setting the calibration unit on the side of the object plane of the projection optical system, thereby calculating the birefringence of the projection optical system, wherein the imaging optical system includes a forward-path optical system configured to guide light from a light source to the projection optical system, and a backward-path optical system configured to guide the light having propagated through the projection optical system to the image sensor, the calibration unit set on the side of the object plane of the projection optical system reflects the incident light back to the measuring unit so that the measuring unit measures the birefringence of the imaging optical system, and the calibration unit set on the side of the object plane of the projection optical system reflects at least three different linearly polarized light components of the incident light back to the measuring unit so that the measuring unit measures a birefringence of the backward-path optical system.

Further features of the present invention will become apparent from the following description of exemplary embodiments with reference to the attached drawings.

DESCRIPTION OF THE EMBODIMENT

A preferred embodiment of the present invention will be described below with reference to the accompanying drawings. The same reference numerals denote the same members throughout the drawings, and a repetitive description thereof will not be given.

Figure 1:
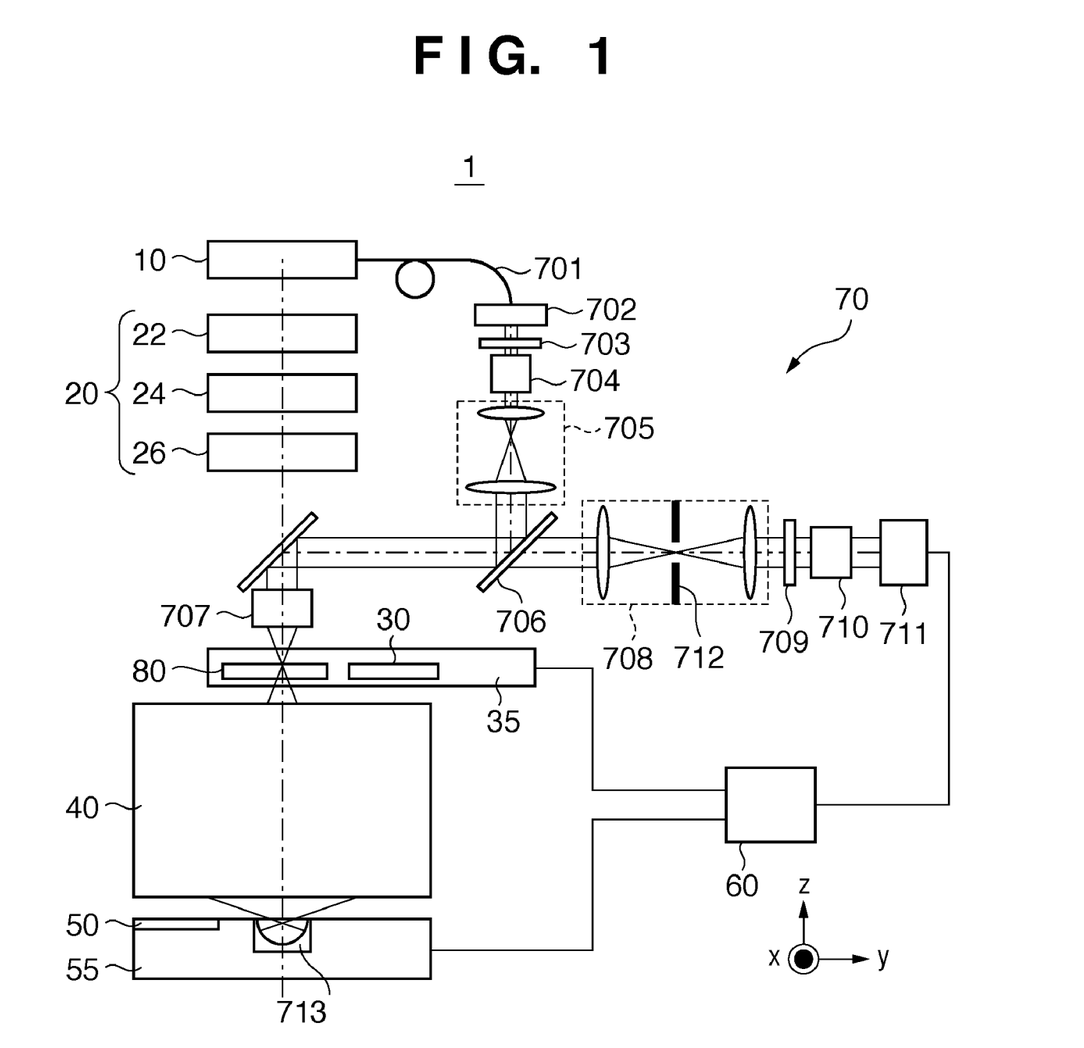
FIG. 1 is a schematic view showing an exposure apparatus according to one aspect of the present invention.

FIG. 1 is a schematic view showing an exposure apparatus 1 according to one aspect of the present invention. In this embodiment, the exposure apparatus 1 is a projection exposure apparatus which transfers the pattern of a reticle 30 onto a wafer 50 by the step & scan scheme. However, the exposure apparatus 1 can adopt the step & repeat scheme or another exposure scheme.

The exposure apparatus 1 includes a light source 10, an illumination optical system 20, a reticle stage (first stage) 35 for holding the reticle 30, a projection optical system 40, a wafer stage (second stage) 55 for holding the wafer 50, a control unit 60, a measuring unit 70, and a calibration unit 80. The exposure apparatus 1 also includes, for example, an alignment detection system and focus detection system (neither are shown).

The light source 10 is, for example, an excimer laser such as an ArF excimer laser having a wavelength of about 193 nm or a KrF excimer laser having a wavelength of about 248 nm. However, the light source 10 is not particularly limited to an excimer laser, and may be an F2 laser having a wavelength of about 157 nm, an EUV (Extreme Ultra Violet) light source having a wavelength of about 10 nm to 15 nm, or a lamp such as a mercury lamp or xenon lamp.

The illumination optical system 20 illuminates the reticle 30 with light from the light source 10. In this embodiment, the illumination optical system 20 includes a shaping optical system 22 for shaping light from the light source 10 into a shape symmetrical about the optical axis, an incoherent optical system 24 for shortening the coherence length, and an illumination system 26 for illuminating the reticle 30.

The reticle 30 has a circuit pattern and is held and driven by the reticle stage 35.

The reticle stage 35 holds the reticle 30 and drives it in the x-, y-, and z-axis directions and the rotation directions about the respective axes. In this embodiment, the reticle stage 35 mounts the calibration unit 80 (to be described later) and drives it in the x-, y-, and z-axis directions and the rotation directions about the respective axes, as in the reticle 30. Note that the scanning direction of the reticle 30 or wafer 50 on its surface is defined as the y-axis direction, a direction perpendicular to the scanning direction is defined as the x-axis direction, and a direction perpendicular to the surface of the reticle 30 or wafer 50 is defined as the z-axis direction.

The projection optical system 40 projects the pattern of the reticle 30 onto the wafer 50. The projection optical system 40 can be a dioptric system catadioptric system, or catoptric system.

The wafer 50 is a substrate onto which the pattern of the reticle 30 is projected (transferred). However, the wafer 50 can be substituted by a glass plate or another substrate.

The wafer stage 55 holds the wafer 50 and drives it in the x-, y-, and z-axis directions and the rotation directions about the respective axes. The wafer stage 55 also holds a concave mirror 713 to be drivable in the x-, y-, and z-axis directions and the rotation directions about the respective axes.

The control unit 60 includes a CPU and memory and controls the operation of the exposure apparatus 1. The control unit 60 synchronously controls the reticle stage 35 and the wafer stage 55 on the order of nanometers based on the measurement results obtained by laser interferometers arranged around the reticle stage 35 and wafer stage 55. The laser interferometers measure the positions of the reticle stage 35 and wafer stage 55 in the optical axis direction (that is, the z-axis direction) of the projection optical system 40, and those on a plane (that is, the x-y plane) perpendicular to the optical axis of the projection optical system 40.

In this embodiment, the control unit 60 also controls the operation of the measuring unit 70 (to be described later) (that is, an operation associated with the calibration of the measuring unit 70 and the measurement of the birefringence of the projection optical system 40 by the measuring unit 70). For example, the control unit 60 controls the driving of the calibration unit 80 and concave mirror 713, which is necessary to calibrate the measuring unit 70 and measure the birefringence of the projection optical system 40, via the reticle stage 35 and wafer stage 55. The control unit 60 also serves as a calculation unit which performs calculation processing necessary to calibrate the measuring unit 70 and measure the birefringence of the projection optical system 40. The control unit 60 calculates, for example, the Jones matrix representing the birefringence, based on an image sensed by an image sensor 711. The control unit 60 also calculates the birefringence of the projection optical system 40 by isolating the birefringence of the measuring unit 70 from the result of measuring the overall birefringence of the measuring unit 70 and projection optical system 40 by the measuring unit 70. The detailed calculation processing by the control unit 60 will be explained in detail later.

The measuring unit 70 includes an imaging optical system for guiding light from the light source 10 to the projection optical system 40 and further guiding the light having propagated through the projection optical system 40 to the image sensor 711, and measures the birefringence of the projection optical system 40. Note that, as described above, because the measuring unit 70 includes an imaging optical system, the measurement result obtained by the measuring unit 70 contains the birefringences of the projection optical system 40 and measuring unit 70 (that is, the birefringence of the imaging optical system). In this embodiment, the measuring unit 70 includes a fiber 701, fiber port 702, λ/2 plate 703, polarizer 704, beam expander 705, half mirror 706, and objective lens 707. The measuring unit 70 also includes a pupil imaging lens 708, λ/4 plate 709, analyzer 710, image sensor 711, spatial filter 712, and concave mirror 713.

Figure 2:
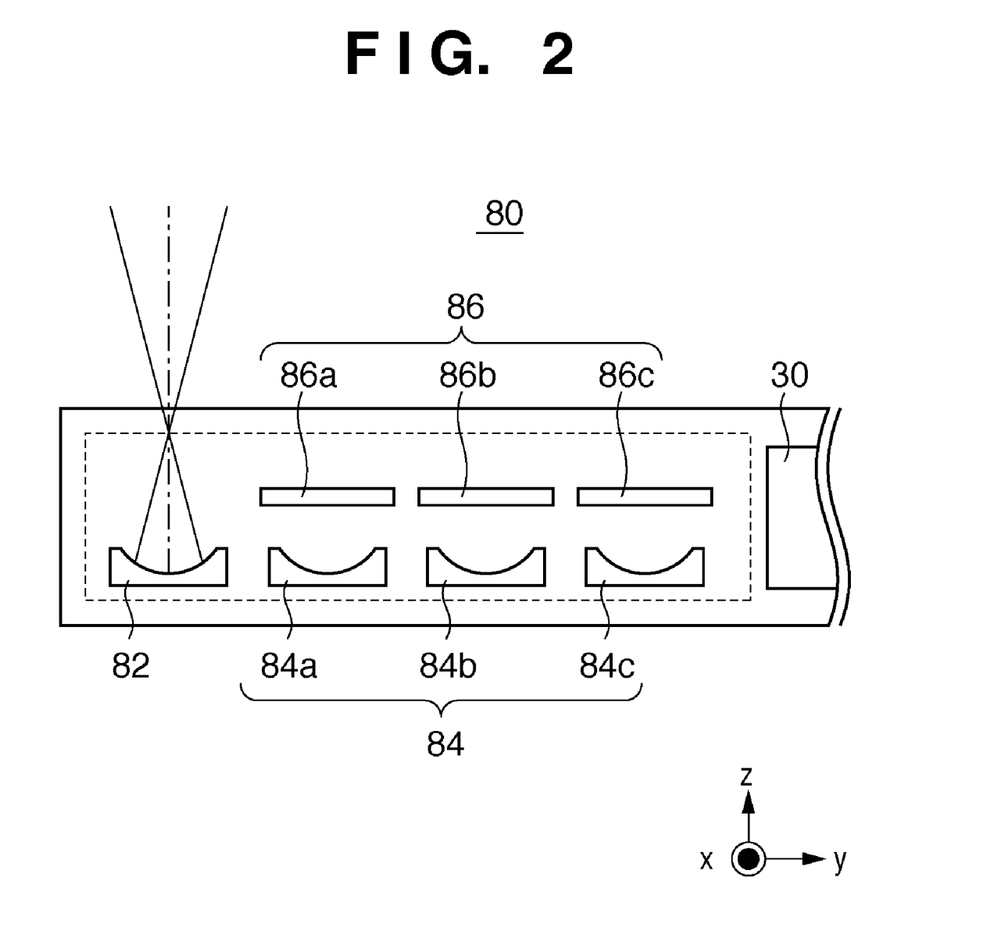
FIG. 2 is a schematic sectional view showing a calibration unit of the exposure apparatus shown in FIG. 1.

The calibration unit 80 is mounted on the reticle stage 35 to be insertable into and retractable from the optical path of the imaging optical system of the measuring unit 70, as described above. The calibration unit 80 is an optical unit set on the side of the object plane of the projection optical system 40 in order to measure the birefringence of the imaging optical system of the measuring unit 70 in calibrating the measuring unit 70. The calibration unit 80 includes, for example, a plurality of mirrors and a plurality of prisms, and reflects light from the measuring unit 70 back to the measuring unit 70 without using the projection optical system 40. The calibration unit 80 includes concave mirrors 82 and 84 and a prism 86, as shown in FIG. 2. The concave mirror 82 is used to measure the birefringence of the whole imaging optical system of the measuring unit 70. The concave mirror 84 and prism 86 are used to measure the birefringence of the backward-path optical system of the imaging optical system of the measuring unit 70. In this embodiment, the prism 86 includes three prisms 86a to 86c, which are set at different angles (for example, 0°, 60°, and 120°) with respect to the z-axis and transmit only predetermined linearly polarized light components. Accordingly, the prisms 86a to 86c transmit three different linearly polarized light components. Three concave mirrors 84a to 84c are set in correspondence with the three prisms 86a to 86c. The concave mirrors 84a to 84c reflect the light components transmitted through the prisms 86a to 86c, respectively, back to the measuring unit 70. Note that FIG. 2 is a schematic sectional view showing the calibration unit 80.

Calculation processing by the control unit 60 will be explained below, together with the detailed arrangements and functions of the measuring unit 70 and calibration unit 80. A method of measuring the system error as the birefringence of the measuring unit 70 will be explained first. As described above, because the birefringence is represented by a Jones matrix, matrix calculation is necessary to isolate (subtract) the system error from the result of measuring the overall birefringence of the measuring unit 70 and projection optical system 40 by the measuring unit 70. It is therefore necessary to separate the imaging optical system of the measuring unit 70 into a forward-path optical system which guides light from the light source 10 to the projection optical system 40, and a backward-path optical system which guides the light from the projection optical system 40 to the image sensor 711, thereby obtaining the birefringences of the forward-path optical system and backward-path optical system. In this embodiment, let J_m be the Jones matrix representing the birefringence of the whole imaging optical system of the measuring unit 70; J_r, the Jones matrix representing the birefringence of the backward-path optical system; and J_g, the Jones matrix representing the birefringence of the forward-path optical system.

Light from the light source 10 comes from the fiber port 702 via the fiber 701. The light leaving the fiber port 702 is transmitted through the λ/2 plate 703 and polarizer 704. The λ/2 plate 703 and polarizer 704 are arranged on a θ stage (not shown). Rotating the λ/2 plate 703 and polarizer 704 makes it possible to obtain known linearly polarized light. The light transmitted through the λ/2 plate 703 and polarizer 704 is reflected by the half mirror 706 via the beam expander 705 which enlarges the light beam diameter, and enters the objective lens 707.

In measuring the birefringence of the whole imaging optical system of the measuring unit 70, the calibration unit 80 mounted on the reticle stage 35 is set on the side of the object plane of the projection optical system 40. More specifically, the calibration unit 80 is set such that the concave mirror 82 is located immediately beneath the objective lens 707 and the focal position of the objective lens 707 matches the center of curvature of the concave mirror 82.

The incident light on the calibration unit 80 is reflected by the concave mirror 82, and enters the λ/4 plate 709, which is arranged on the θ stage, via the objective lens 707, half mirror 706, and pupil imaging lens 708. The light modulated by the λ/4 plate 709 enters the image sensor 711 via the analyzer 710. At this time, the image sensor 711 senses only a linearly polarized light component determined by the angle of the analyzer 710.

In this way, three different angles (for example, 0°, 60°, and 120°) are set in the polarizer 704, and three polarization parameters are measured, thereby calculating the Jones matrix. The polarization parameters and Jones matrix are obtained by the phase retarder method. The phase retarder method is disclosed in Japanese Patent Laid-Open No. 2006-214856, and a detailed description thereof will not be given herein. With this operation, the Jones matrix J_m representing the birefringence from the polarizer 704 to the λ/4 plate 709, that is, the birefringence of the whole imaging optical system of the measuring unit 70 can be obtained.

In measuring the birefringence of the backward-path optical system of the measuring unit 70, the calibration unit 80 is set such that the concave mirror 84 and prism 86 are located immediately beneath the objective lens 707. For example, when the calibration unit 80 is set such that the concave mirror 84a and prism 86a are located immediately beneath the objective lens 707, the light reflected by the concave mirror 84a is known linearly polarized light determined by the angle of the prism 86a. Accordingly, a polarization parameter upon guiding linearly polarized light determined by the angle of the prism 86a to the birefringences of the objective lens 707, half mirror 706, and pupil imaging lens 708 is measured. Likewise, three different polarization parameters can be measured by setting the calibration unit 80 such that a set of the concave mirror 84b and prism 86b and a set of the concave mirror 84c and prism 86c are located immediately beneath the objective lens 707. With this operation, the Jones matrix J_r representing the birefringence from the objective lens 707 to the λ/4 plate 709, that is, the birefringence of the backward-path optical system of the measuring unit 70 can be obtained.

The prism 86 in the calibration unit 80 will be explained herein. In this embodiment, the prism 86 is a Wollaston prism. A Wollaston prism splits the incident light into ordinary light and extraordinary light at equal angles. For this reason, when a Wollaston prism is used as the prism 86, it is necessary to shield extraordinary light by the spatial filter 712 to prevent it from entering the image sensor 711.

A splitting angle $\theta_D$ of ordinary light and extraordinary light is given by:

$$\theta_D = \Delta r/f0 \qquad (1)$$

where $\Delta r$ is the opening radius of the spatial filter 712, and f0 is the focal length of the pupil imaging lens 708, and more specifically, the focal length of a lens set on the side of the half mirror 706, of lenses which constitute the pupil imaging lens 708.

Because a Wollaston prism outputs ordinary light in a direction tilted with respect to the incident light as well, the position of the concave mirror 84 must be adjusted so that the ordinary light passes through (the opening of) the spatial filter 712.

A Wollaston prism has a feature that the coupling angle of the prism can be decreased as long as the splitting angle $\theta_D$ is small. This makes it possible to downsize the Wollaston prism, thus suppressing the generation of any aberration even when it is set near the focal position of the objective lens 707 as the prism 86. A general prism is made of a birefringent glass material, so it causes a phase difference in the crystal axis direction upon setting it at the focal position. However, it is possible to prevent the generation of any aberration by inserting a birefringent glass material which cancels the phase difference between the concave mirror 84 and the prism 86.

Although a Wollaston prism is used as the prism 86 in this embodiment, it can be substituted by a prism such as a Glan-Thompson prism or a Savart plate if the aperture angle of the objective lens 707 is small.

Using the Jones matrices J_m and J_r, the Jones matrix J_g representing the birefringence from the polarizer 704 to the objective lens 707, that is, the birefringence of the forward-path optical system of the measuring unit 70 can be calculated by:

$$J\_g = J\_r^{-1} \times J\_m \qquad (2)$$

where $J\_r^{-1}$ is the inverse matrix of the Jones matrix J_r representing the birefringence of the backward-path optical system of the measuring unit 70.

A method of isolating (subtracting) the system error from the result of measuring the overall birefringence of the measuring unit 70 and projection optical system 40 by the measuring unit 70 will be explained next. The calibration unit 80 is retracted from the optical path of the imaging optical system of the measuring unit 70, and the objective lens 707 is set such that the focal position of the objective lens 707 matches the object point of the projection optical system 40. Also, the concave mirror 713 is set such that the center of curvature of the concave mirror 713 held by the wafer stage 55 matches the image point of the projection optical system 40.

The light from the objective lens 707 propagates through the projection optical system 40, and is perpendicularly reflected by the concave mirror 713. The light perpendicularly reflected by the concave mirror 713 propagates through the projection optical system 40 again, and enters the image sensor 711 via the objective lens 707, half mirror 706, pupil imaging lens 708, λ/4 plate 709, and analyzer 710. At this time, the overall birefringence of the measuring unit 70 and projection optical system 40 is measured.

Letting J_a be the Jones matrix representing the overall birefringence of the measuring unit 70 and projection optical system 40, the Jones matrix J_p representing the birefringence of the projection optical system 40 can be calculated by:

$$J\_p = (J\_r^{-1} \times J\_a \times J\_g^{-1})^{1/2} \qquad (3)$$

The root calculation of the matrix is the same as in Japanese Patent Laid-Open No. 2006-214856, and a detailed description thereof will not be given herein.

In this manner, according to this embodiment, it is possible to obtain the birefringences of the forward-path optical system and backward-path optical system of the measuring unit 70 by performing measurement twice, and to isolate the system error from the overall birefringence of the measuring unit 70 and projection optical system 40. Hence, the exposure apparatus 1 can accurately measure the birefringence of the projection optical system 40 as mounted in the exposure apparatus 1 in a short period of time.

Figure 3:
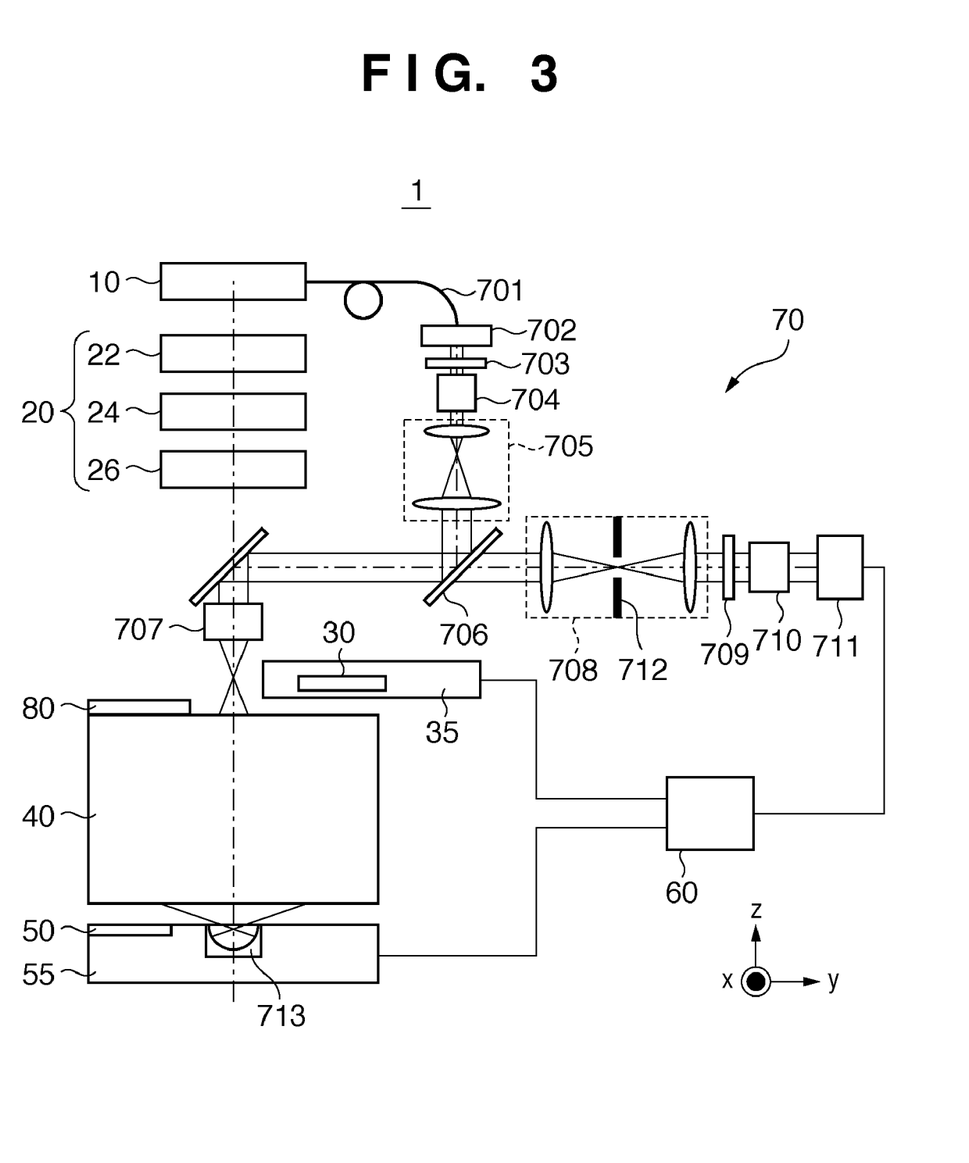
FIG. 3 is a schematic view showing an exposure apparatus according to one aspect of the present invention.

Although the calibration unit 80 is mounted on the reticle stage 35 in this embodiment, it may be mounted in the projection optical system 40 (more specifically, on the incident surface of a lens barrel which forms the projection optical system 40), as shown in FIG. 3. In this case, it is necessary that the objective lens 707 can be driven so as to be located immediately above the calibration unit 80. Note that FIG. 3 is a schematic view showing an exposure apparatus 1 according to one aspect of the present invention.

Figure 4:
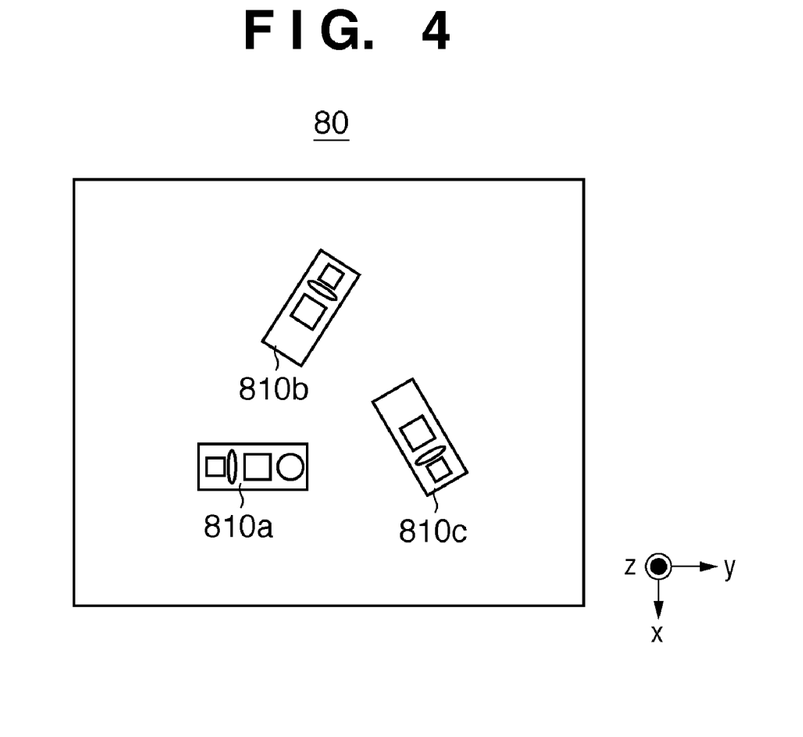
FIG. 4 is a schematic view showing another calibration unit of the exposure apparatus shown in FIG. 1.

The calibration unit 80 may include three optical units 810a to 810c arranged at different angles, as shown in FIG. 4. In this case, the optical units 810a to 810c are located immediately beneath the objective lens 707, and measure three different polarization parameters, thereby calculating the Jones matrix. The optical units 810a to 810c may be mounted on the reticle stage 35 or in the projection optical system 40. Note that FIG. 4 is a schematic sectional view showing another calibration unit 80.

Figure 5:
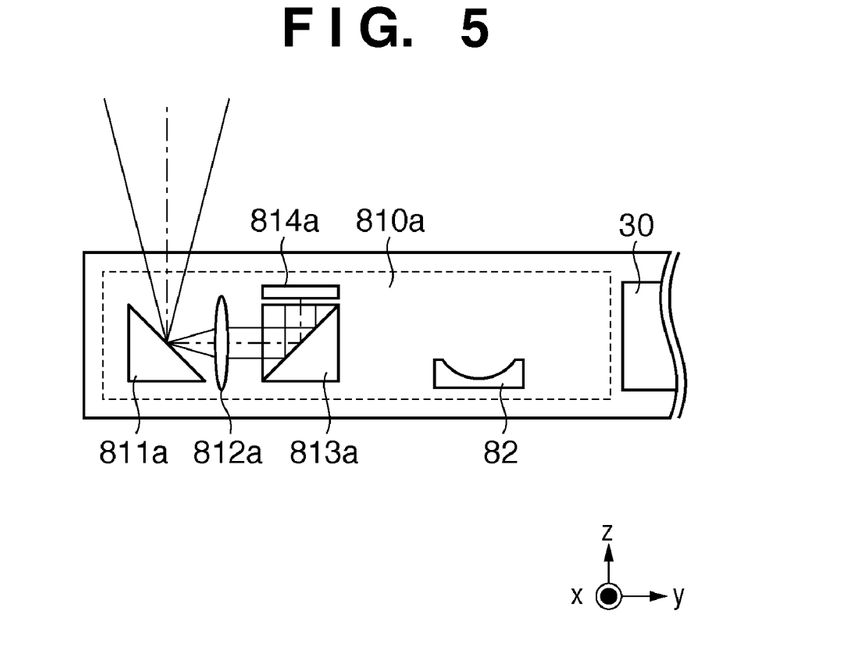
FIG. 5 is a schematic sectional view showing an optical unit of the calibration unit shown in FIG. 4.

FIG. 5 is a schematic sectional view showing the optical unit 810a. The optical unit 810a includes the concave mirror 82, a bending mirror 811a, a lens 812a, a polarizing beam splitter 813a, and a reflecting mirror 814a, as shown in FIG. 5. The concave mirror 82 is used to measure the birefringence of the whole imaging optical system of the measuring unit 70, as described above. The bending mirror 811*a*, lens 812*a*, polarizing beam splitter 813*a*, and reflecting mirror 814*a* are used to measure the birefringence of the backward-path optical system of the imaging optical system of the measuring unit 70. Each of the optical units 810*b* and 810*c* has the same arrangement as that of the optical unit 810*a* except that each of them does not have the concave mirror 82, and a detailed description thereof will not be given herein.

In measuring the birefringence of the backward-path optical system of the measuring unit 70, the optical unit 810*a* is set such that the bending mirror 811*a* is located immediately beneath the objective lens 707. The light from the objective lens 707 is perpendicularly deflected by the bending mirror 811*a*, and enters the lens 812*a*. The incident light on the lens 812*a* is collimated into collimated light and enters the polarizing beam splitter 813*a*. Of the incident light, a linearly polarized light component determined by the angle of the polarizing beam splitter 813*a* strikes the reflecting mirror 814*a*. The incident light on the reflecting mirror 814*a* is perpendicularly reflected back to the objective lens 707 via the polarizing beam splitter 813*a*, lens 812*a*, and bending mirror 811*a*. The bending mirror 811*a* and lens 812*a* are preferably made of a glass material having a birefringence sufficiently lower than that of the backward-path optical system of the measuring unit 70. With this arrangement, the polarization parameter becomes approximately identical to that obtained upon guiding linearly polarized light determined by the polarizing beam splitter 813*a* to the backward-path optical system of the measuring unit 70. Performing the same measurement using the optical units 810*b* and 810*c* makes it possible to obtain the Jones matrix J_r representing the birefringence of the backward-path optical system of the measuring unit 70 from three polarization parameters. A method of measuring (calculating) the Jones matrix J_m representing the birefringence of the whole imaging optical system of the measuring unit 70, and a method of isolating the system error from the overall birefringence of the measuring unit 70 and projection optical system 40 are the same as above.

Although the optical unit 810*a* includes the reflecting mirror 814*a* in this embodiment, a reflection film may be formed on the exit surface (a surface facing the reflecting mirror 814*a*) of the polarizing beam splitter 813*a*, instead of using the reflecting mirror 814*a*. Also, the light transmitted through the polarizing beam splitter 813*a* may be perpendicularly reflected, instead of perpendicularly reflecting the light reflected by the polarizing beam splitter 813*a*.

If the bending mirror 811*a* and lens 812*a* cannot be made of a glass material having a birefringence sufficiently lower than that of the backward-path optical system of the measuring unit 70, their birefringences are measured in advance. The polarization state of the light which enters the backward-path optical system of the measuring unit 70 may be calculated based on the birefringences of the bending mirror 811*a* and lens 812*a*.

In the operation of the exposure apparatus 1, the birefringence of the projection optical system 40 is measured first. The birefringence of the projection optical system 40 can be obtained by measuring the birefringence of the measuring unit 70 (system error) using the calibration unit 80, and isolating the system error from the result of measuring the overall birefringence of the measuring unit 70 and projection optical system 40 by the measuring unit 70, as described above. As the birefringence of the projection optical system 40 is measured, it is adjusted based on the measurement result. The birefringence of the projection optical system 40 can be adjusted by, for example, rotating an optical element which constitutes the projection optical system 40 about the optical axis or driving it in the optical axis direction. As described above, because the measuring unit 70 can accurately measure the birefringence of the projection optical system 40 in a short period of time, it, in turn, can be accurately adjusted in a shot period of time.

Next, the pattern of the reticle 30 is transferred onto the wafer 50 by exposure. Light emitted by the light source 10 illuminates the reticle 30 by the illumination optical system 20. The light which bears the information of the pattern of the reticle 30 forms an image on the wafer 50 by the projection optical system 40. As described above, the birefringence of the projection optical system 40 used for the exposure apparatus 1 is adjusted accurately, thus achieving an excellent imaging capacity. Hence, the exposure apparatus 1 can provide high-quality devices (e.g., a semiconductor device, an LCD device, an image sensing device (e.g., a CCD), and a thin-film magnetic head) with a high throughput and a good economical efficiency. Note that the devices are fabricated by a step of exposing a substrate (for example, a wafer or glass plate) coated with a photoresist (photosensitive agent) using the exposure apparatus 1, a step of developing the exposed substrate, and other known steps.

Figure 6:
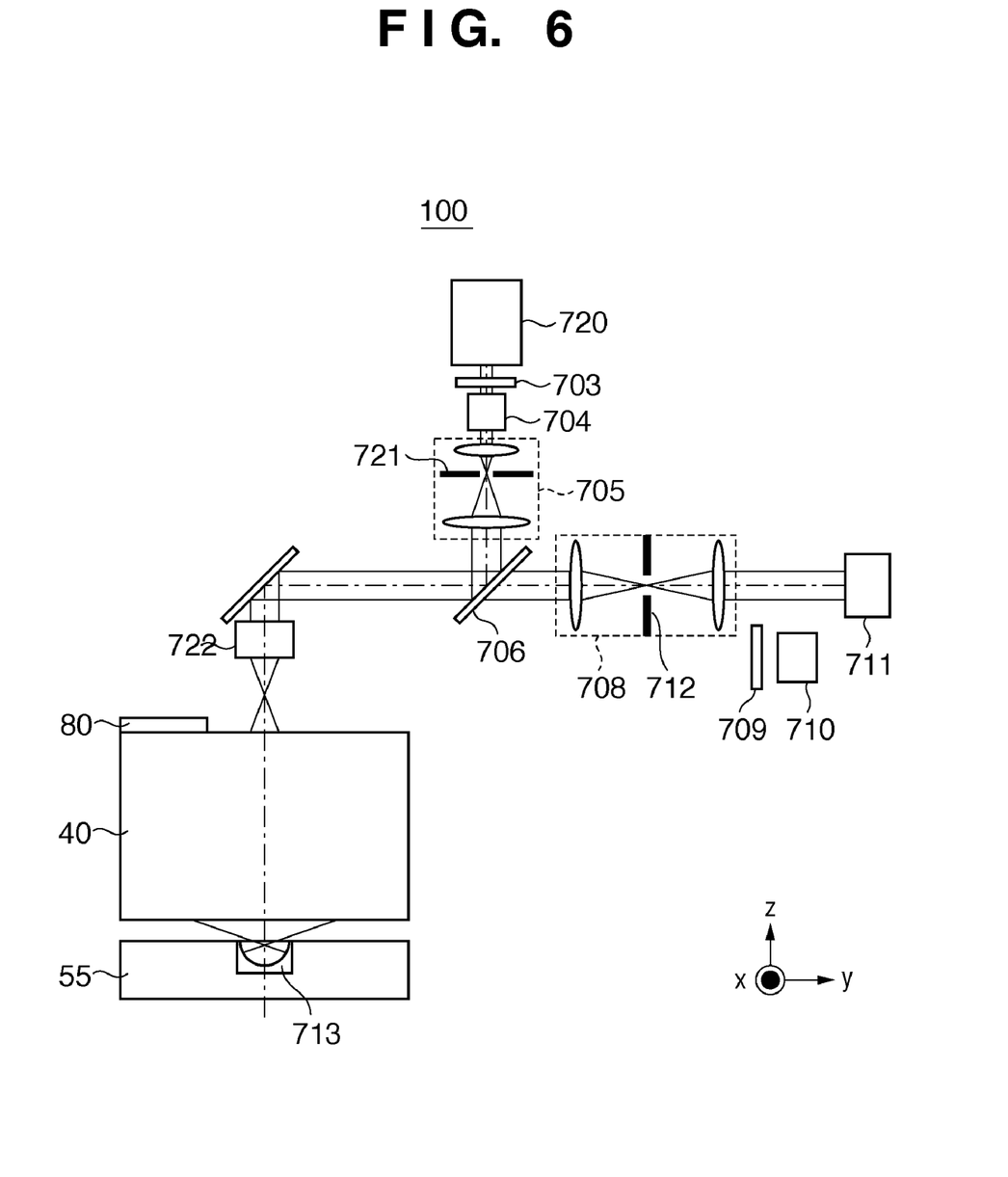
FIG. 6 is a schematic view showing a Fizeau interferometer to which the calibration unit according to this embodiment is applied.

The calibration unit 80 according to this embodiment is also applicable to a Fizeau interferometer 100, as shown in FIG. 6. The interferometer 100 has a configuration which implements a function of measuring the transmitted wavefront aberration of the projection optical system 40, and that of measuring the birefringence of the projection optical system 40, as will be described later. FIG. 6 is a schematic view showing the Fizeau interferometer 100 to which the calibration unit 80 is applied.

The interferometer 100 includes a $\lambda/2$ plate 703, polarizer 704, beam expander 705, half mirror 706, pupil imaging lens 708, $\lambda/4$ plate 709, analyzer 710, image sensor 711, spatial filter 712, and concave mirror 713. The interferometer 100 also includes an interferometer light source 720 having a long coherence length, and a wavefront shaping pinhole 721 in order to measure the transmitted wavefront aberration. The interferometer 100 also includes a so-called TS lens 722 in place of the objective lens 707. The TS lens 722 has its final surface whose center of curvature matches the lens focal position, and transmits a certain component of the light which enters the final surface and reflects the remaining component. The $\lambda/4$ plate 709 and analyzer 710 are insertable into and retractable from the optical path of the interferometer 100. In measuring the transmitted wavefront aberration of the projection optical system 40, the $\lambda/4$ plate 709 and analyzer 710 are retracted from the optical path of the measuring unit 70.

In measuring the transmitted wavefront aberration of the projection optical system 40, the so-called fringe scan method of finely driving the concave mirror 713 held by the wafer stage 55 in the z-axis direction and modulating the phase is used. The concave mirror 713 may be driven by the wafer stage 55 or by attaching a piezoelectric actuator to the concave mirror 713. The phase can be modulated even by finely driving the TS lens 722 in the z-axis direction in place of the concave mirror 713.

In measuring the birefringence of the projection optical system 40, the $\lambda/4$ plate 709 and analyzer 710 are inserted in the optical path of the interferometer 100. Because the calibration unit 80 is mounted in the projection optical system 40, the TS lens 722 is located immediately above the calibration unit 80 in calibrating the interferometer 100. To measure the birefringence of the projection optical system 40 by the interferometer 100, it is necessary to remove an interference pattern generated upon measuring the transmitted wavefront aberration by driving the spatial filter 712 or using, for example, the average intensity of the interference pattern. A method of removing the interference pattern is disclosed in Japanese Patent Laid-Open No. 2006-214856, and a detailed description thereof will not be given herein. A method of measuring the birefringences of the projection optical system 40 and (the imaging optical system of) the interferometer 100 is as above.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-035084 filed on Feb. 15, 2008, which is hereby incorporated by reference herein in its entirety.

What is claimed is:

1. An exposure apparatus comprising:
   a projection optical system configured to project a pattern of a reticle held by a first stage onto a substrate held by a second stage;
   a measuring unit which includes an imaging optical system configured to guide light having propagated through the projection optical system to an image sensor, and is configured to measure the overall birefringence of the imaging optical system and the projection optical system;
   a calibration unit which is set on a side of an object plane of the projection optical system in order to measure a birefringence of the imaging optical system in calibrating the measuring unit, and is configured to reflect the light from the measuring unit back to the measuring unit without using the projection optical system; and
   a calculation unit configured to isolate, from the result of measuring the overall birefringence of the imaging optical system and the projection optical system by the measuring unit, the birefringence of the imaging optical system measured by the measuring unit by setting the calibration unit on the side of the object plane of the projection optical system, thereby calculating the birefringence of the projection optical system,
   wherein the imaging optical system includes a forward-path optical system configured to guide light from a light source to the projection optical system, and a backward-path optical system configured to guide the light having propagated through the projection optical system to the image sensor,
   the calibration unit set on the side of the object plane of the projection optical system reflects the incident light back to the measuring unit so that the measuring unit measures the birefringence of the imaging optical system, and
   the calibration unit set on the side of the object plane of the projection optical system reflects at least three different linearly polarized light components of the incident light back to the measuring unit so that the measuring unit measures a birefringence of the backward-path optical system.

2. The apparatus according to claim 1, wherein the calibration unit is mounted on the first stage.

3. The apparatus according to claim 1, wherein the calibration unit is mounted in the projection optical system.

4. The apparatus according to claim 1, wherein the calibration unit is insertable into and retractable from an optical path of the imaging optical system.

5. The apparatus according to claim 1, wherein the calibration unit includes:
   a mirror configured to reflect the incident light back to the measuring unit,
   a plurality of prisms configured to respectively transmit the at least three different linearly polarized light components of the incident light, and
   a plurality of mirrors configured to respectively reflect the light components transmitted through the plurality of prisms back to the measuring unit.

6. The apparatus according to claim 5, wherein each of the plurality of prisms includes a Wollaston prism.

7. The apparatus according to claim 1, wherein
   the calibration unit includes a plurality of optical units each including a polarizing beam splitter configured to reflect a predetermined linearly polarized light component of the incident light, and a mirror configured to reflect the light component reflected by the polarizing beam splitter back to the measuring unit,
   the plurality of optical units are set such that the polarizing beam splitters respectively reflect the at least three different linearly polarized light components, and
   one optical unit of the plurality of optical units further includes a mirror configured to reflect the incident light back to the measuring unit.

8. The apparatus according to claim 1, wherein the calculation unit isolates the birefringence of the backward-path optical system measured by the measuring unit from the birefringence of the imaging optical system measured by the measuring unit, thereby calculating a birefringence of the forward-path optical system.

9. A device fabrication method comprising steps of:
   exposing a substrate using an exposure apparatus; and
   performing a development process for the substrate exposed,
   wherein the exposure apparatus includes:
   a projection optical system configured to project a pattern of a reticle held by a first stage onto the substrate held by a second stage;
   a measuring unit which includes an imaging optical system configured to guide light having propagated through the projection optical system to an image sensor, and is configured to measure the overall birefringence of the imaging optical system and the projection optical system;
   a calibration unit which is set on a side of an object plane of the projection optical system in order to measure a birefringence of the imaging optical system in calibrating the measuring unit, and is configured to reflect the light from the measuring unit back to the measuring unit without using the projection optical system; and
   a calculation unit configured to isolate, from the result of measuring the overall birefringence of the imaging optical system and the projection optical system by the measuring unit, the birefringence of the imaging optical system measured by the measuring unit by setting the calibration unit on the side of the object plane of the projection optical system, thereby calculating the birefringence of the projection optical system,
   wherein the imaging optical system includes a forward-path optical system configured to guide light from a light source to the projection optical system, and a backward-path optical system configured to guide the light having propagated through the projection optical system to the image sensor,
   the calibration unit set on the side of the object plane of the projection optical system reflects the incident light back to the measuring unit so that the measuring unit measures the birefringence of the imaging optical system, and the calibration unit set on the side of the object plane of the projection optical system reflects at least three different linearly polarized light components of the incident light back to the measuring unit so that the measuring unit measures a birefringence of the backward-path optical system.

* * * * *